United States Patent
Son et al.

(10) Patent No.: US 9,868,868 B2
(45) Date of Patent: Jan. 16, 2018

(54) OFFSET PRINTING COMPOSITION, PRINTING METHOD USING SAME, AND PATTERN COMPRISING OFFSET PRINTING COMPOSITION

(71) Applicant: LG CHEM, LTD., Seoul (KR)

(72) Inventors: Yong Goo Son, Daejeon (KR); Jooyeon Kim, Daejeon (KR); Seung Heon Lee, Daejeon (KR); Han Min Seo, Daejeon (KR); Ji Eun Myung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/114,035

(22) PCT Filed: Mar. 6, 2015

(86) PCT No.: PCT/KR2015/002204
§ 371 (c)(1),
(2) Date: Jul. 25, 2016

(87) PCT Pub. No.: WO2015/133867
PCT Pub. Date: Sep. 11, 2015

(65) Prior Publication Data
US 2016/0340527 A1    Nov. 24, 2016

(30) Foreign Application Priority Data
Mar. 6, 2014 (KR) .................. 10-2014-0026775

(51) Int. Cl.
*B41F 13/193* (2006.01)
*C09D 11/03* (2014.01)
*C09D 11/033* (2014.01)
*C09D 11/10* (2014.01)
*C09D 11/103* (2014.01)
*H05K 1/00* (2006.01)

(52) U.S. Cl.
CPC ............ *C09D 11/03* (2013.01); *B41F 13/193* (2013.01); *C09D 11/033* (2013.01); *C09D 11/10* (2013.01); *C09D 11/103* (2013.01); *H05K 1/00* (2013.01)

(58) Field of Classification Search
CPC ..... B41F 13/193; C09D 11/03; C09D 11/033; C09D 11/10; C09D 11/103
USPC ................... 428/195.1; 106/31.13, 31.85
See application file for complete search history.

(56) References Cited

U.S. PATENT DOCUMENTS

2014/0007786 A1   1/2014   Son et al.
2014/0127408 A1   5/2014   Son et al.

FOREIGN PATENT DOCUMENTS

| JP | 2012180472 A | 9/2012 |
|---|---|---|
| KR | 1020010009433 A | 2/2001 |
| KR | 1020080090890 A | 10/2008 |
| KR | 1020090003883 A | 1/2009 |
| KR | 1020090020076 A | 2/2009 |
| KR | 1020090108841 A | 10/2009 |
| KR | 1020110018030 A | 2/2011 |
| KR | 1020120113682 A | 10/2012 |
| KR | 1020120113683 A | 10/2012 |

*Primary Examiner* — Bruce H Hess
(74) *Attorney, Agent, or Firm* — Dentons US LLP

(57) ABSTRACT

The present specification relates to an offset printing composition, a printing method using the same, and a pattern including the offset printing composition.

18 Claims, 2 Drawing Sheets

[Figure 1]
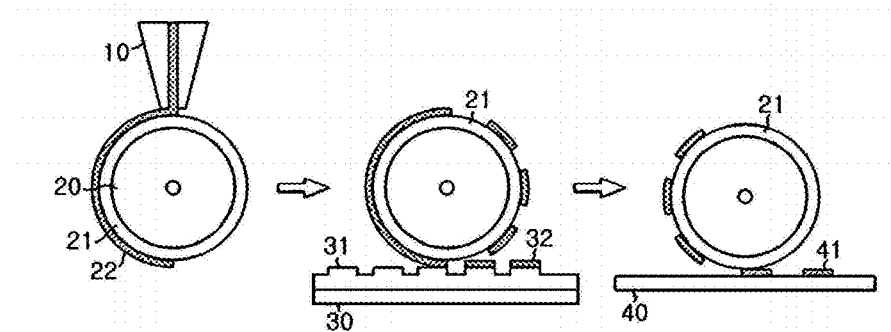
[Figure 2]
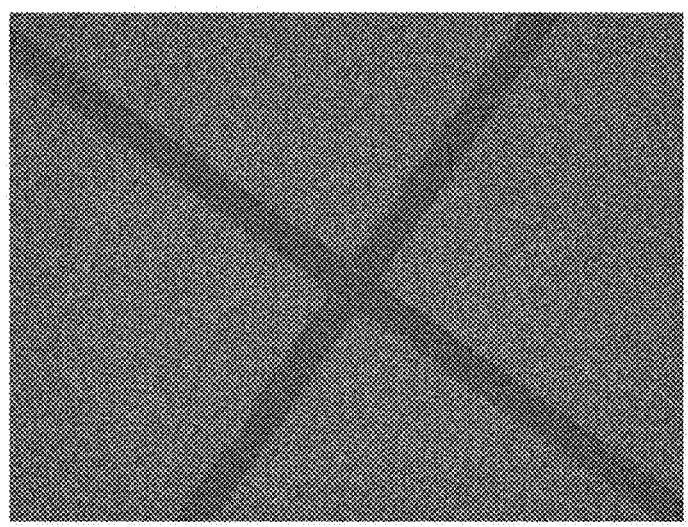
[Figure 3]
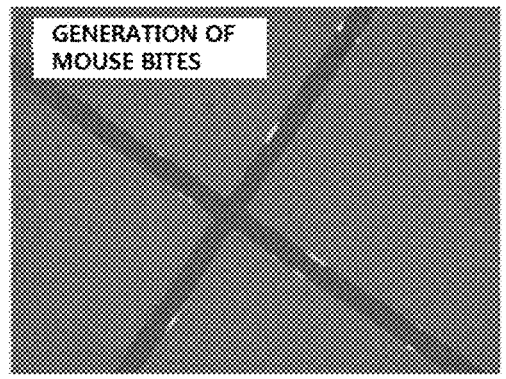

[Figure 4]
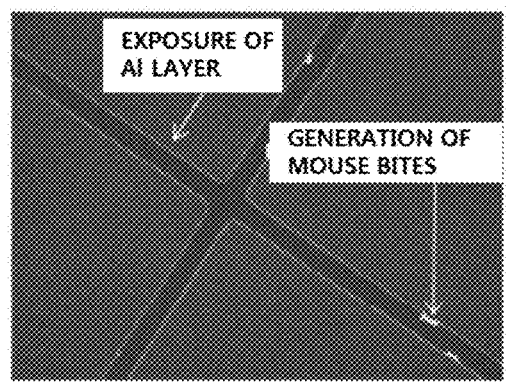

OFFSET PRINTING COMPOSITION, PRINTING METHOD USING SAME, AND PATTERN COMPRISING OFFSET PRINTING COMPOSITION

TECHNICAL FIELD

This application is a National Stage Application of International Application No. PCT/KR2015/002204, filed Mar. 6, 2015, and claims the benefit of Korean Patent Application No. 10-2014-0026775, filed Mar. 6, 2014, the contents of which are incorporated herein by reference in their entirety for all purposes as if fully set forth below.

The present specification relates to an offset printing composition, a printing method using the same, and a pattern including the offset printing composition.

BACKGROUND ART

In general, electronic devices such as a liquid crystal display device and a semiconductor device are manufactured by forming patterns of multiple layers on a substrate. In order to form these patterns, a photolithography process has been usually used up to now. However, the photolithography process has problems in that the manufacturing process is complicated, and a large amount of chemical wastes harmful to the environment are generated because predetermined pattern masks need to be manufactured and chemical etching and stripping processes need to be repeated. This leads to an increase in manufacturing costs, thereby degrading competitiveness of products. A roll printing method using a printing roll has been proposed as a new method of forming patterns in order to solve the disadvantages of the photolithography process.

There are various roll printing methods, but the methods may be largely classified into two methods of a gravure printing method and a reverse offset printing method.

The gravure printing is a printing method that performs printing by covering ink on a concave plate and scratching extra ink and has been known as a method suitable for printing of various fields such as publication, packaging, cellophane, vinyl, and polyethylene, and studies for applying the gravure printing method to manufacturing active devices or circuit patterns applied to display devices have been conducted. Since the gravure printing transfers ink to a substrate by using a transfer roll, the patterns may be formed by a one-time transfer by using a transfer roll corresponding to an area of a desired display device even in the case of a large-area display device. The gravure printing may form the ink patterns for resist on the substrate and may be used to pattern various patterns of display devices, for example, not only a TFT, but also a gate line and a data line which are connected to the TFT, a pixel electrode, and a metal pattern for a capacitor, in the case of a liquid crystal display device.

However, a blanket typically used for gravure printing is manufactured by casting a silicone-based resin into a solid master mold, and the blanket thus manufactured has a limitation in being manufactured so as to have a uniform thickness and is also difficult to be mass-produced on a pilot scale. Thus, in order to form precisely fine patterns, the reverse offset printing method is usually adopted.

For the related art relating to the reverse offset printing method and the printing apparatus, it is possible to refer to the following Documents 1 to 4 which were filed and published by an applicant of the present invention.

The entire contents of the specifications of the following Documents 1 to 4 are a description of the related art of the present invention and are hereby incorporated by reference into the specification of the present invention.

PATENT DOCUMENT

Korea Patent Application Publication No. 10-2008-0090890
Korea Patent Application Publication No. 10-2009-0020076
Korea Patent Application Publication No. 10-2009-0003883
Korea Patent Application Publication No. 10-2009-0108841

DETAILED DESCRIPTION OF THE INVENTION

Technical Problem

The present specification provides an offset printing composition, a printing method using the same, and a pattern comprising the offset printing composition.

Technical Solution

An exemplary embodiment of the present specification provides an offset printing composition comprising: 1) a binder resin; 2) a transfer and adhesion improving agent including a compound represented by the following Formula 1; 3) a low-boiling point solvent having a boiling point of less than 100° C.; and a high-boiling point solvent having a boiling point of 180° C. or more, in which a silicone-based blanket is used.

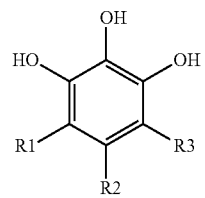

[Formula 1]

In Formula 1,
R1 to R3 are the same as or different from each other, and are each independently a hydrogen or a substituted or unsubstituted alkyl group having 1 to 12 carbon atoms.

Further, another exemplary embodiment of the present specification provides an offset printing method, comprising: coating the offset printing composition onto a silicone-based blanket; bringing a cliche into contact with an offset printing composition coating film applied on the silicone-based blanket to remove a part of the coating film; and transferring the offset printing composition coating film remaining on the silicone-based blanket to an object to be printed.

In addition, yet another exemplary embodiment of the present specification provides a pattern including the offset printing composition.

Advantageous Effects

The offset printing composition according to an exemplary embodiment of the present specification may implement a fine pattern by an offset printing method, particularly, a reverse offset printing method.

The offset printing composition according to an exemplary embodiment of the present specification may suppress residues from being generated by greatly improving transfer characteristics during the process of bringing a cliche into contact with the silicone-based blanket to remove a part of the coating film.

The offset printing composition according to an exemplary embodiment of the present specification is excellent in adhesion with an object to be printed, and thus, may prevent an etchant from permeating into the interface between the printing composition and the object to be printed. Specifically, when a metal substrate is etched by an etchant, it is possible to prevent a line width of the metal fine pattern from being excessively reduced after etching compared to the line width of the printing composition pattern, or to prevent the form of the metal fine pattern from being irregularly formed due to excellent adhesion to the metal substrate.

Further, the offset printing composition according to the present specification is excellent in thermal resistance and chemical resistance.

In addition, a pattern formed by drying or curing the offset printing composition according to the present specification is advantageous in that insulation performance is excellent.

BRIEF DESCRIPTION OF DRAWINGS

FIG. 1 exemplarily illustrates a process schematic view of a reverse offset printing method of the present specification.

FIG. 2 illustrates the result of evaluating the etching according to Example 1.

FIG. 3 illustrates the result of evaluating the etching according to Comparative Example 1.

FIG. 4 illustrates the result of evaluating the etching according to Comparative Example 4.

EXPLANATION OF REFERENCE NUMERALS AND SYMBOLS

10: Coater for coating metal pattern material on blanket
20: Roll-type support for supporting blanket
21: Blanket
22: Printing composition pattern material applied on blanket
30: Cliche support
31: Cliche having a pattern
40: Object to be printed
41: Printing composition pattern transferred to object to be printed

BEST MODE FOR CARRYING OUT THE INVENTION

Hereinafter, the present specification will be described in more detail.

An exemplary embodiment of the present specification provides an offset printing composition comprising: 1) a binder resin; 2) a transfer and adhesion improving agent including a compound represented by the following Formula 1; 3) a low-boiling point solvent having a boiling point of less than 100° C.; and 4) a high-boiling point solvent having a boiling point of 180° C. or more, in which a silicone-based blanket is used.

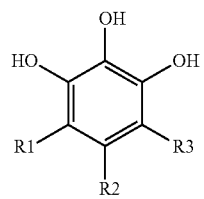

[Formula 1]

In Formula 1,

R1 to R3 are the same as or different from each other, and are each independently a hydrogen or a substituted or unsubstituted alkyl group having 1 to 12 carbon atoms.

According to an exemplary embodiment of the present specification, R1 to R3 of Formula 1 are the same as or different from each other, and may be each independently a hydrogen; a substituted or unsubstituted methyl group; or a substituted or unsubstituted ethyl group.

According to an exemplary embodiment of the present specification, R1 to R3 of Formula 1 are the same as or different from each other, and may be each independently a hydrogen; a methyl group; or an ethyl group.

According to an exemplary embodiment of the present specification, all of R1 to R3 of Formula 1 may be a hydrogen.

According to an exemplary embodiment of the present specification, R2 of Formula 1 may be a methyl group.

According to an exemplary embodiment of the present specification, R2 of Formula 1 may be an ethyl group.

According to an exemplary embodiment of the present specification, R3 of Formula 1 may be a methyl group.

The present inventors have found that when the offset printing composition is used, fine patterns may be implemented more easily. Furthermore, the present inventors have found that in the printing composition, the printing waiting margin is improved, and continuous printing characteristics are excellent. Further, the present inventors have found that the printing composition is excellent in thermal resistance, chemical resistance, and insulation functions.

Specifically, the present inventors have found that when offset printing is performed using the offset printing composition, the composition remains on the blanket in the off step, and thus may prevent the residues from being formed on an object to be printed. Furthermore, since the offset printing composition is excellent in adhesion with the object to be printed, an etchant minimally permeates into the interface between the offset printing composition and the object to be printed during etching of the object to be printed, thereby manufacturing a metal fine pattern at a low defective rate. Specifically, when a metal substrate is etched by an etchant, it is possible to prevent a line width of the metal fine pattern from being excessively reduced after etching compared to the line width of the printing composition pattern, or to prevent the form of the metal fine pattern from being irregularly formed due to excellent adhesion to the metal substrate.

That is, the offset printing composition according to an exemplary embodiment of the present specification may suppress residues from being generated and prevent the reduction in line width and irregular etching, and thus, may significantly reduce the defective rate of fine patterns.

According to an exemplary embodiment of the present specification, the content of the transfer and adhesion improving agent may be 0.1 wt % to 5 wt % based on the total weight of the offset printing composition.

When the content of the transfer and adhesion improving agent is within the range, generation of residues, reduction in line width, and irregular etching are suppressed, thereby reducing the defective rate of fine patterns. Specifically, when the content of the transfer and adhesion improving agent is less than 0.1 wt % based on the total weight of the offset printing composition, the transfer and adhesion improving effects are minimal, so that a large amount of residues is generated, the line width of the fine pattern is excessively reduced or irregular etching is increased during etching, and thus, the defective rate is greatly increased. Further, when the content of the transfer and adhesion improving agent is more than 5 wt % based on the total weight of the offset printing composition, the chemical resistance of a coating film is decreased, thereby generating loss of fine patterns during the etching process.

According to an exemplary embodiment of the present specification, the binder resin may be a novolac resin.

The novolac resin has an advantage in that the resin is preferable to form a resist pattern and has excellent compatibility with solvents which satisfy the conditions according to the aforementioned printing composition of the present specification. In addition, the novolac resin has advantages in that the novolac resin is excellent in chemical resistance against the etchant, and thus, the etching process may be stably performed, and the solubility against a stripping solution is excellent, so that foreign materials are minimally generated after stripping, and the stripping time is shortened.

According to an exemplary embodiment of the present specification, the novolac resin may have a weight average molecular weight of 1,000 to 20,000. When the weight average molecular weight is less than 1,000, chemical resistance against the etchant is not sufficiently secured, and thus, cracks and stripping may occur on the resist coating film during the etching process, and when the weight average molecular weight exceeds 20,000, solubility against the stripping solution may deteriorate depending on the curing conditions.

The novolac resin may be prepared through a condensation reaction of a phenol-based compound and an aldehyde-based compound. As the phenol-based compound, it is possible to use those known in the art, for example, at least one selected from the group consisting of m-cresol, o-cresol, p-cresol, 2,5-xylenol, 3,4-xylenol, 3,5-xylenol, and 2,3,5-trimethylphenol. As the aldehyde-based compound, it is possible to use those known in the art, for example, at least one selected from the group consisting of formaldehyde, paraformaldehyde, acetldehyde, benzaldehyde, phenylaldehyde, and salicylaldehyde. The novolac resin may further include any monomer within the range not impairing the object of the present invention.

According to an exemplary embodiment of the present specification, the binder resin may be 5 wt % to 20 wt % based on the total weight of the offset printing composition.

When the content of the binder resin is within the range, a problem with storage stability of the offset printing composition including the binder resin does not occur, and the composition may be uniformly applied. Specifically, when the content of the binder resin is less than 5 wt %, the viscosity is excessively decreased, so that it is difficult to adjust the discharge amount during the application. Further, when the content of the binder resin exceeds 20 wt %, the solubility against the solvent included in the offset printing composition is decreased, so that a precipitate is generated while storing for over a long time, and the viscosity of the solution is excessively increased, so that it is difficult to uniformly apply the solution.

According to an exemplary embodiment of the present specification, the low-boiling point solvent having a boiling point of less than 100° C. may include one or two or more selected from the group consisting of dimethyl carbonate, methanol, methyl ethyl ketone, acetone, isopropyl alcohol, ethyl acetate, ethanol, propanol, and normal hexane.

According to an exemplary embodiment of the present specification, the low-boiling point solvent having a boiling point of less than 100° C. may be 50 wt % to 90 wt % based on the total weight of the offset printing composition.

When the content of the low-boiling point solvent having a boiling point of less than 100° C. is within the range, a fine pattern of the offset printing composition may be implemented, and the offset printing composition may be uniformly applied. Specifically, when the content of the low-boiling point solvent having a boiling point of less than 100° C. is less than 50 wt %, the viscosity is excessively increased, and thus it is impossible to uniformly apply the composition, and there occurs a problem in that the waiting time after application for implementing a fine pattern is increased. Further, when the content of the low-boiling point solvent having a boiling point of less than 100° C. exceeds 90 wt %, the viscosity is excessively decreased, and thus, it is difficult to adjust the discharge amount during the application, so that there occurs a problem in that the printing waiting margin deteriorates.

According to an exemplary embodiment of the present specification, the high-boiling point solvent having a boiling point of 180° C. or more may include one or two or more selected from the group consisting of resorcinol; m-cresol; o-cresol; p-cresol; benzyl alcohol; propylene glycol; 1,3-propanediol; 1,3-butanediol; 2,3-butanediol; 1,4-butanediol; 1,5-pentanediol; 1,4-pentanediol; 1,3-pentanediol; 2,4-pentanediol; 1,6-hexanediol; 1,5-hexanediol; 1,4-hexanediol; 1,3-hexanediol; 1,2-hexanediol; 2,3-hexanediol; 2,4-hexanediol; 2,5-hexanediol; 3,4-hexanediol; and gamma butyrolactone.

According to an exemplary embodiment of the present specification, the high-boiling point solvent having a boiling point of 180° C. or more may be 1 wt % to 30 wt % based on the total weight of the offset printing composition.

When the content of the high-boiling point solvent having a boiling point of 180° C. or more is within the range, printing waiting margin and continuous printing are excellent. Specifically, when the content of the high-boiling point solvent having a boiling point of 180° C. or more is less than 1 wt %, the coating film formed between the off processes after application or between the set processes after the off process is rapidly dried, so that the pattern is not implemented. In addition, when the content of the high-boiling point solvent having a boiling point of 180° C. or more exceeds 30 wt %, the solvent remains in an excessive amount in the coating film, so that there occurs a problem in that the line width of the pattern is increased.

In the offset printing composition according to an exemplary embodiment of the present specification, a low-boiling point solvent having a boiling point of less than 100° C. and a high-boiling point solvent having a boiling point of 180° C. or more are used together, and between the solvents, the low-boiling point solvent having a boiling point of less than 100° C. allows the printing composition to maintain low viscosity and excellent applicability for the blanket until the printing composition is applied on the blanket, is removed by volatilization to increase the viscosity of the printing composition, and allows the pattern to be formed and maintained well on the blanket. Meanwhile, the high-boiling point solvent having a boiling point of 180° C. or more is a solvent having relatively low volatility, and may impart tackiness to the printing composition until the pattern is transferred to the object to be printed. By using two or more solvent having different boiling points in the offset printing composition of the present specification, the viscosity of the printing composition may be more finely adjusted as described above.

In the present specification, the low-boiling point solvent having a boiling point of less than 100° C. may have a boiling point of less than 100° C., specifically, 95° C. or less, and more specifically 90° C. or less. By including the low-boiling point solvent having a boiling point of less than 100° C. within the numerical range, the process waiting time may be reduced until the cliche is brought into contact with the printing composition coating film applied on the blanket to remove a part of the coating film after the printing composition is applied on the blanket, and a swelling phenomenon of the blanket may be reduced.

In the present specification, the low-boiling point solvent having a boiling point of less than 100° C. may have a boiling point of 50° C. or more. When the boiling point of the low-boiling point solvent having a boiling point of less than 100° C. is too low, there may occur a problem in that the printing composition is dried in the nozzle when the printing composition is applied on the blanket. Further, the low-boiling point solvent having a boiling point of less than 100° C. may have a boiling point of 50° C. or more in order to make the leveling properties immediately after the printing composition is applied excellent.

The high-boiling point solvent having a boiling point of 180° C. or more according to the present specification may have a boiling point of 180° C. or more. By including the high-boiling point solvent having a boiling point of 180° C. or more within the numerical range, tackiness may be imparted to the printing composition until a pattern is transferred to the object to be printed, the process waiting time may be reduced, and a swelling phenomenon of the blanket may be reduced.

The high-boiling point solvent having a boiling point of 180° C. or more according to the present specification may have a boiling point of 300° C. or less and 250° C. or less. A solvent having a boiling point of 250° C. or less in the high-boiling point solvent having a boiling point of 180° C. or more may prevent a problem in that the solvent remains in the final printed material, and thus, it takes a lot of time to dry or cure the solvent, and may also improve the precision of the printing pattern.

According to an exemplary embodiment of the present specification, the offset printing composition may further include a surfactant.

The surfactant may be a leveling agent, a wetting agent, and a slip agent, which are usually used, and it is possible to use, for example, silicone-based, fluorine-based, or polyether-based surfactants.

As the silicone-based surfactant, it is possible to use BYK-077, BYK-085, BYK-300, BYK-301, BYK-302, BYK-306, BYK-307, BYK-310, BYK-320, BYK-322, BYK-323, BYK-325, BYK-330, BYK-331, BYK-333, BYK-335, BYK-341v344, BYK-345v346, BYK-348, BYK-354, BYK-355, BYK-356, BYK-358, BYK-361, BYK-370, BYK-371, BYK-375, BYK-380, BYK-390 and the like, which are manufactured by BYK-Chemie Co., Ltd., and as the fluorine-based surfactant, it is possible to use F-114, F-177, F-410, F-411, F-450, F-493, F-494, F-443, F-444, F-445, F-446, F-470, F-471, F-472SF, F-474, F-475, F-477, F-478, F-479, F-480SF, F-482, F-483, F-484, F-486, F-487, F-172D, MCF-350SF, TF-1025SF, TF-1117SF, TF-1026SF, TF-1128, TF-1127, TF-1129, TF-1126, TF-1130, TF-1116SF, TF-1131, TF1132, TF1027SF, TF-1441, TF-1442 and the like, which are manufactured by DaiNippon Ink & Chemicals (DIC), Inc., but the surfactants are not limited thereto.

According to an exemplary embodiment of the present specification, the content of the surfactant may be 0.001 wt % to 0.5 wt % based on the total weight of the offset printing composition.

When the content of the surfactant is within the range, there is an advantage in that the printing composition is uniformly applied and the pattern implementation is excellent. Specifically, when the content of the surfactant is less than 0.01 wt %, there is a problem in that pinholes and stripe unevenness are generated in large amounts during the application because the surface energy of the offset printing composition is not sufficiently reduced. In addition, when the content of the surfactant exceeds 0.5 wt %, there is a problem in that bubbles are generated in the offset printing composition, and thus, comet unevenness is generated during application.

The printing composition according to the present specification may be prepared by mixing the aforementioned components. The printing composition may be prepared by conducting filtration with a filter, if necessary. Foreign materials or dust may be removed by the filtration as described above.

According to an exemplary embodiment of the present specification, the offset printing composition may be for forming a resist pattern or an insulation pattern.

The present specification provides an offset printing method, including: coating the offset printing composition onto a silicone-based blanket; bringing a cliche into contact with an offset printing composition coating film applied on the silicone-based blanket to remove a part of the coating film; and transferring the offset printing composition coating film remaining on the silicone-based blanket to an object to be printed.

A reverse offset printing method according to an exemplary embodiment of the present specification is exemplified in FIG. 1. The reverse offset printing method includes: i) applying a printing composition on a blanket; ii) bringing a cliche in which a pattern corresponding to a pattern to be formed is formed in an intaglio type into contact with the blanket to form a pattern of the printing composition corresponding to the pattern on the blanket; and iii) transferring the pattern of the printing composition on the blanket to an object to be printed. In this case, the outer peripheral part of the blanket is composed of a silicone-based material.

In FIG. 1, reference numeral 10 designates a coater which coats a metal pattern material on the blanket, reference numeral 20 designates a roll-type support for supporting a blanket, reference numeral 21 designates a blanket, and reference numeral 22 designates a printing composition pattern material applied on a blanket. Reference numeral 30 designates a cliche support, and reference numeral 31 designates a cliche having a pattern, in which a pattern corresponding to a pattern to be formed is formed in an intaglio type. Reference numeral 40 designates an object to be printed, and Reference numeral 41 designates a printing composition pattern transferred to the object to be printed.

According to an exemplary embodiment of the present specification, the offset printing method may additionally include drying or curing the offset printing composition transferred to the object to be printed. In the drying or curing, the process temperature may be selected from a room temperature to 350° C., and the drying or curing temperature may be selected from a normal temperature to 350° C., specifically, 50° C. to 300° C., depending on the binder resin. The drying or curing time may be selected depending on the component and composition of the composition and the processing temperature.

The present specification provides a pattern formed by drying or curing the printing composition.

Specifically, according to an exemplary embodiment of the present specification, the pattern may be a resist pattern or an insulation pattern.

According to an exemplary embodiment of the present specification, the pattern may have a line width of 1 µm to 100 µm.

MODE FOR INVENTION

Hereinafter, the present specification will be described in detail with reference to the Examples for specifically describing the present specification. However, the Examples according to the present specification may be modified in various forms, and it is not interpreted that the scope of the present specification is limited to the Examples described below in detail. The Examples of the present specification are provided for more completely explaining the present specification to the person with ordinary skill in the art.

Example 1

A printing composition was prepared by dissolving 10 g of a novolac resin having a polystyrene-converted weight average molecular weight of 4,000 prepared by mixing m-cresol and p-cresol at a weight ratio of 5:5, 1 g of a transfer and adhesion improving agent pyrogallol, and 0.4 g of a surfactant in 83.6 g of a low-boiling point solvent ethanol and 5 g of a high-boiling point solvent 1,4-butanediol, and then filtering the resulting mixture with a filter having an aperture of 1 µm. For the prepared printing composition, the measurement of front transfer rate, the evaluation of residue generation, the evaluation of etching, the measurement of pattern precision, and the evaluation of continuous printing characteristics were performed by the methods of the following Experimental Examples 1 to 5.

Example 2

A printing composition was prepared by dissolving 10 g of a novolac resin having a polystyrene-converted weight average molecular weight of 4,000 prepared by mixing m-cresol and p-cresol at a weight ratio of 5:5, 1 g of a transfer and adhesion improving agent 5-methylpyrogallol, and 0.4 g of a surfactant in 83.6 g of a low-boiling point solvent ethanol and 5 g of a high-boiling point solvent 1,4-butanediol, and then filtering the resulting mixture with a filter having an aperture of 1 µm. For the prepared printing composition, the measurement of front transfer rate, the evaluation of residue generation, the evaluation of etching, the measurement of pattern precision, and the evaluation of continuous printing characteristics were performed by the methods of the following Experimental Examples 1 to 5.

Example 3

A printing composition was prepared by dissolving 10 g of a novolac resin having a polystyrene-converted weight average molecular weight of 4,000 prepared by mixing m-cresol and p-cresol at a weight ratio of 5:5, 1 g of a transfer and adhesion improving agent 5-ethylpyrogallol, and 0.4 g of a surfactant in 83.6 g of a low-boiling point solvent ethanol and 5 g of a high-boiling point solvent 1,4-butanediol, and then filtering the resulting mixture with a filter having an aperture of 1 µm. For the prepared printing composition, the measurement of front transfer rate, the evaluation of residue generation, the evaluation of etching, the measurement of pattern precision, and the evaluation of continuous printing characteristics were performed by the methods of the following Experimental Examples 1 to 5.

Example 4

A printing composition was prepared by dissolving 10 g of a novolac resin having a polystyrene-converted weight average molecular weight of 4,000 prepared by mixing m-cresol and p-cresol at a weight ratio of 5:5, 1 g of a transfer and adhesion improving agent 4-methyl-5-ethylpyrogallol, and 0.4 g of a surfactant in 83.6 g of a low-boiling point solvent ethanol and 5 g of a high-boiling point solvent 1,4-butanediol, and then filtering the resulting mixture with a filter having an aperture of 1 µm. For the prepared printing composition, the measurement of front transfer rate, the evaluation of residue generation, the evaluation of etching, the measurement of pattern precision, and the evaluation of continuous printing characteristics were performed by the methods of the following Experimental Examples 1 to 5.

Comparative Example 1

A printing composition was prepared by dissolving 10 g of a novolac resin having a polystyrene-converted weight average molecular weight of 4,000 prepared by mixing m-cresol and p-cresol at a weight ratio of 5:5, 1 g of a transfer and adhesion improving agent methyl gallate, and 0.4 g of a surfactant in 83.6 g of a low-boiling point solvent ethanol and 5 g of a high-boiling point solvent 1,4-butanediol, and then filtering the resulting mixture with a filter having an aperture of 1 µm. For the prepared printing composition, the measurement of front transfer rate, the evaluation of residue generation, the evaluation of etching, the measurement of pattern precision, and the evaluation of continuous printing characteristics were performed by the methods of the following Experimental Examples 1 to 5.

Comparative Example 2

A printing composition was prepared by dissolving 10 g of a novolac resin having a polystyrene-converted weight average molecular weight of 4,000 prepared by mixing m-cresol and p-cresol at a weight ratio of 5:5, 1 g of a transfer and adhesion improving agent catechol, and 0.4 g of a surfactant in 83.6 g of a low-boiling point solvent ethanol and 5 g of a high-boiling point solvent 1,4-butanediol, and then filtering the resulting mixture with a filter having an aperture of 1 µm. For the prepared printing composition, the measurement of front transfer rate, the evaluation of residue generation, the evaluation of etching, the measurement of pattern precision, and the evaluation of continuous printing characteristics were performed by the methods of the following Experimental Examples 1 to 5.

Comparative Example 3

A printing composition was prepared by dissolving 10 g of a novolac resin having a polystyrene-converted weight average molecular weight of 4,000 prepared by mixing m-cresol and p-cresol at a weight ratio of 5:5, 1 g of a transfer and adhesion improving agent gallic acid, and 0.4 g of a surfactant in 83.6 g of a low-boiling point solvent ethanol and 5 g of a high-boiling point solvent 1,4-butanediol, and then filtering the resulting mixture with a filter having an aperture of 1 μm. For the prepared printing composition, the measurement of front transfer rate, the evaluation of residue generation, the evaluation of etching, the measurement of pattern precision, and the evaluation of continuous printing characteristics were performed by the methods of the following Experimental Examples 1 to 5.

Comparative Example 4

A printing composition was prepared by dissolving 10 g of a novolac resin having a polystyrene-converted weight average molecular weight of 4,000 prepared by mixing m-cresol and p-cresol at a weight ratio of 5:5, 1 g of a transfer and adhesion improving agent hexamethoxymethylmelamine, and 0.4 g of a surfactant in 83.6 g of a low-boiling point solvent ethanol and 5 g of a high-boiling point solvent 1,4-butanediol, and then filtering the resulting mixture with a filter having an aperture of 1 μm. For the prepared printing composition, the measurement of front transfer rate, the evaluation of residue generation, the evaluation of etching, the measurement of pattern precision, and the evaluation of continuous printing characteristics were performed by the methods of the following Experimental Examples 1 to 5.

Comparative Example 5

A printing composition was prepared by dissolving 10 g of a novolac resin having a polystyrene-converted weight average molecular weight of 4,000 prepared by mixing m-cresol and p-cresol at a weight ratio of 5:5, 1 g of a transfer and adhesion improving agent aminopropyltriethoxysilane, and 0.4 g of a surfactant in 83.6 g of a low-boiling point solvent ethanol and 5 g of a high-boiling point solvent 1,4-butanediol, and then filtering the resulting mixture with a filter having an aperture of 1 μm. For the prepared printing composition, the measurement of front transfer rate, the evaluation of residue generation, the evaluation of irregular etching, the measurement of pattern precision, and the evaluation of continuous printing characteristics were performed by the methods of the following Experimental Examples 1 to 5.

Comparative Example 6

A printing composition was prepared by dissolving 10 g of a novolac resin having a polystyrene-converted weight average molecular weight of 4,000 prepared by mixing m-cresol and p-cresol at a weight ratio of 5:5, 0.05 g of a transfer and adhesion improving agent pyrogallol, and 0.4 g of a surfactant in 84.55 g of a low-boiling point solvent ethanol and 5 g of a high-boiling point solvent 1,4-butanediol, and then filtering the resulting mixture with a filter having an aperture of 1 μm. For the prepared printing composition, the measurement of front transfer rate, the evaluation of residue generation, the evaluation of etching, the measurement of pattern precision, and the evaluation of continuous printing characteristics were performed by the methods of the following Experimental Examples 1 to 5.

Comparative Example 7

A printing composition was prepared by dissolving 10 g of a novolac resin having a polystyrene-converted weight average molecular weight of 4,000 prepared by mixing m-cresol and p-cresol at a weight ratio of 5:5, 6 g of a transfer and adhesion improving agent pyrogallol, and 0.4 g of a surfactant in 78.6 g of a low-boiling point solvent ethanol and 5 g of a high-boiling point solvent 1,4-butanediol, and then filtering the resulting mixture with a filter having an aperture of 1 μm. For the prepared printing composition, the measurement of front transfer rate, the evaluation of residue generation, the evaluation of etching, the measurement of pattern precision, and the evaluation of continuous printing characteristics were performed by the methods of the following Experimental Examples 1 to 5.

<Experimental Example 1> Measurement of Front Transfer Rate

Coating films having a thickness of 2 μm before drying were formed by applying the printing compositions in Examples 1 to 4 and Comparative Examples 1 to 7 on a silicone-based blanket having a Shore A hardness of 47 at a speed of 65 mm/sec. After being applied, each of the printing composition was left to stand for 10 seconds, and then transferred to the front surface of a glass substrate having a size of 370 mm470 mm under conditions of a printing process speed of 65 mm/sec and an off-printing pressure (contact pressure: a length modified at one point when the printing pressure is applied) of 20 μm to measure the area of the printing composition transferred to the glass substrate which is an object to be printed. The measurement result for this is shown in the following Table 1.

Front transfer rate (%)=Area $mm^2$ of printing composition transferred to an object to be printed/ (370 mm470 mm)100

A: 100% transferred
B: 80% transferred
C: 50% transferred
D: 30% transferred
E: 10% transferred
F: Not transferred <Experimental Example 2> Evaluation of Residue Generation Coating films having a thickness of 2 μm before drying were formed by applying the printing compositions in Examples 1 to 4 and Comparative Examples 1 to 7 on a silicone-based blanket having a Shore A hardness of 47 at a speed of 65 mm/sec. After being applied, each of the printing composition was left to stand for 10 seconds, and then transferred to a cliche having a size of 370 mm470 mm, which has an intaglio mesh pattern with a line width of 3 μm and a line-to-line width of 300 μm under conditions of an off process speed of 65 mm/sec and an off-printing pressure (contact pressure: a length modified at one point when the printing pressure is applied) of 20 μm to form a pattern corresponding to the cliche on the blanket. The printing composition pattern formed on the blanket was transferred to an aluminum deposition film subjected to surface darkness treatment under the conditions of a set process speed of 65 mm/sec and a set printing pressure of 100 μm to form a final pattern, and then the number of the remaining ink composition (residues) other than the pattern corresponding to the cliche was observed by an optical microscope. The measurement result for this is shown in the following Table 1.

A: 10 or less residues having a long side of 3 μm or more
B: 50 or less residues having a long side of 3 μm or more C: 100 or less residues having a long side of 3 μm or more D: More than 100 residues having a long side of 3 μm or more <Experimental Example 3> Evaluation of Etching The printing composition was printed on the aluminum deposition film subjected to surface darkness treatment as in Experimental Example 2, and then dried at 90° C. for 3 minutes, and the line width of the printing composition was measured by an optical microscope. The completely dried substrate to be printed was etched for 1 minute by using an etchant composed of phosphoric acid, nitric acid, and acetic acid, the printing composition remaining on the upper part of the metal pattern was peeled, the line width of the metal pattern was measured by an optical microscope, and it was observed whether the mouse bites occurred. The measurement result for this is shown in the following Table 1.

Change in line width after etching=Line width of printing composition pattern−Line width of metal pattern  [Equation]

A: Change in line width after etching was less than 0.2 μm, and no mouse bites occurred B: Change in line width after etching was less than 0.2 μm, and mouse bites occurred C: Change in line width after etching was 0.2 μm or more and less than 0.5 μm, and no mouse bites occurred D: Change in line width after etching was 0.2 μm or more and less than 0.5 μm, and mouse bites occurred E: Change in line width after etching was 0.5 μm or more <Experimental Example 4> Measurement of Pattern Precision Coating films having a thickness of 2 μm before drying were formed by applying the printing compositions in Examples 1 to 4 and Comparative Examples 1 to 7 on a silicone-based blanket having a Shore A hardness of 47 at a speed of 65 mm/sec. After being applied, each of the printing composition was left to stand for 10 seconds, and then transferred to a cliche having a size of 370 mm470 mm, which has an intaglio mesh pattern with a line width of 3 μm and a line-to-line width of 300 μm under conditions of an off process speed of 65 mm/sec and an off-printing pressure (contact pressure: a length modified at one point when the printing pressure is applied) of 20 μm to form a pattern corresponding to the cliche on the blanket. A final pattern was formed by transferring the printing composition pattern formed on the blanket to the aluminum deposition film subjected to surface darkness treatment under the conditions of a set process speed of 65 mm/sec and a set printing pressure of 100 μm. The secured pattern was observed by an optical microscope, and evaluated by the following criteria. The measurement result for this is shown in the following Table 1.

Rate of change in line width=(Line width of printing pattern)/(Line width of cliche pattern)100

A: Rate of change in line width was within 5%, and pattern crossing part was normally implemented B: Rate of change in line width was within 10%, and short-circuit occurred in pattern crossing part C: Rate of change in line width was within 20%, and pattern crossing part was normally implemented D: Rate of change in line width was within 20%, and short-circuit occurred in pattern crossing part E: Rate of change in line width was 20% or more, and short-circuit occurred in pattern crossing part <Experimental Example 5> Evaluation of Continuous Printing Characteristics A continuous printing process was performed in the same manner as in Experimental Example 4 to measure the number of continuous printings which maintained a rate of change in the line width within 10% compared to the initial line width of the printing pattern. The measurement result for this is shown in the following Table 1.

TABLE 1

|  | Transfer and adhesion improving agent | Content of transfer and adhesion improving agent (wt %) | Front transfer rate | Generation of residues | Etching | Pattern precision | Continuous printing characteristics (sheet) |
| --- | --- | --- | --- | --- | --- | --- | --- |
| Example 1 | Pyrogallol | 1 | A | A | A | A | 100 or more |
| Example 2 | 5-methyl Pyrogallol | 1 | A | A | A | A | 100 or more |
| Example 3 | 5-ethyl Pyrogallol | 1 | A | A | A | A | 100 or more |
| Example 4 | 5-ethyl-4-methyl Pyrogallol | 1 | A | A | A | A | 100 or more |
| Comparative Example 1 | Methylgallate | 1 | A | A | B | A | 100 or more |
| Comparative Example 2 | Catechol | 1 | A | A | B | A | 100 or more |
| Comparative Example 3 | Gallic acid | 1 | A | A | B | A | 100 or more |
| Comparative Example 4 | Hexamethoxy methylmelamine | 1 | A | B | C | B | 50 or more |
| Comparative Example 5 | Aminopropyl triethoxy silane | 1 | A | C | C | A | 50 or more |
| Comparative Example 6 | Pyrogallol | 0.05 | B | C | C | A | 100 or more |

TABLE 1-continued

| | Transfer and adhesion improving agent | Content of transfer and adhesion improving agent (wt %) | Front transfer rate | Generation of residues | Etching | Pattern precision | Continuous printing characteristics (sheet) |
|---|---|---|---|---|---|---|---|
| Comparative Example 7 | Pyrogallol | 6 | A | A | B | A | 100 or more |

FIG. 2 illustrates the result of evaluating the etching according to Example 1, and FIG. 3 illustrates the result of evaluating the etching according to Comparative Example 1. FIG. 4 illustrates the result of evaluating the etching according to Comparative Example 4.

As known from the results of FIGS. 2 and 3, the composition for offset printing according to an exemplary embodiment of the present specification may form an excellent pattern. In the case of FIG. 3, an irregular pattern region such as a mouse bite was generated, and in the case of FIG. 4, the Al layer occurred and a problem in that a pattern was irregularly formed was found. In contrast, in the case of FIG. 2, it can be seen that an irregular region such as a mouse bite was not found, and an excellent result was shown.

As can be seen from the result in Table 1, the composition for offset printing according to an exemplary embodiment of the present specification exhibits excellent characteristics in the measurement of front transfer rate, the evaluation of residue generation, the evaluation of etching, the measurement of pattern precision, and the evaluation of continuous printing characteristics. Specifically, it can be seen that in the case of including the transfer and adhesion improving agent according to an exemplary embodiment of the present specification, excellent characteristics are exhibited. Further, as can be seen from the results of Comparative Examples 6 and 7, when the content range of the transfer and adhesion improving agent is less than 1 wt % or more than 5 wt %, an adverse effect occurs.

The invention claimed is:

1. An offset printing composition comprising:
   1) a binder resin;
   2) a transfer and adhesion improving agent comprising a compound of Formula 1:

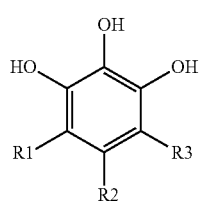

[Formula 1]

wherein R1 to R3 are the same as or different from each other, and are each independently a hydrogen or a substituted or unsubstituted alkyl group having 1 to 12 carbon atoms;
   3) a low-boiling point solvent having a boiling point of less than 100° C.; and
   4) a high-boiling point solvent having a boiling point of 180° C. or more.

2. The offset printing composition of claim 1, wherein the binder resin is a novolac resin.

3. The offset printing composition of claim 2, wherein the novolac resin has a weight average molecular weight of 1,000 to 20,000.

4. The offset printing composition of claim 1, wherein the low-boiling point solvent having a boiling point of less than 100° C. comprises one or two or more selected from the group consisting of dimethyl carbonate, methanol, methyl ethyl ketone, acetone, isopropyl alcohol, ethyl acetate, ethanol, propanol, and normal hexane.

5. The offset printing composition of claim 1, wherein the high-boiling point solvent having a boiling of 180° C. or more comprises one or two or more selected from the group consisting of resorcinol; m-cresol; o-cresol; p-cresol; benzyl alcohol; propylene glycol; 1,3-propanediol; 1,3-butanediol; 2,3-butanediol; 1,4-butanediol; 1,5-pentanediol; 1,4-pentanediol; 1,3-pentanediol; 2,4-pentanediol; 1,6-hexanediol; 1,5-hexanediol; 1,4-hexanediol; 1,3-hexanediol; 1,2-hexanediol; 2,3-hexanediol; 2,4-hexanediol; 2,5-hexanediol; 3,4-hexanediol; and gamma butyrolactone.

6. The offset printing composition of claim 1, wherein the binder resin is 5 wt % to 20 wt % based on a total weight of the offset printing composition.

7. The offset printing composition of claim 1, wherein a content of the transfer and adhesion improving agent is 0.1 wt % to 5 wt % based on the total weight of the offset printing composition.

8. The offset printing composition of claim 1, wherein the low-boiling point solvent having a boiling point of less than 100° C. is 50 wt % to 90 wt % based on the total weight of the offset printing composition.

9. The offset printing composition of claim 1, wherein the high-boiling point solvent having a boiling point of 180° C. or more is 1 wt % to 30 wt % based on the total weight of the offset printing composition.

10. The offset printing composition of claim 1, wherein the offset printing composition further comprises a surfactant.

11. The offset printing composition of claim 10, wherein a content of the surfactant is 0.001 wt % to 0.5 wt % based on a total weight of the offset printing composition.

12. The offset printing composition of claim 1, wherein the offset printing composition is for forming a resist pattern or an insulation pattern.

13. The offset printing composition of claim 1, wherein the offset printing composition is for reverse offset printing.

14. A pattern formed by drying or curing the offset printing composition of claim 1.

15. The pattern of claim 14, wherein the pattern is a resist pattern or an insulation pattern.

16. The pattern of claim 14, wherein the pattern has a line width of 1 μm to 100 μm.

17. An offset printing method, comprising:
   coating onto a silicone-based blanket an offset printing composition comprising:

a binder resin;

a transfer and adhesion improving agent comprising a compound of Formula 1:

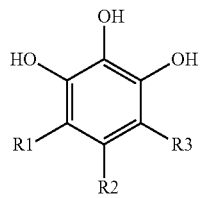

[Formula 1]

wherein R1 to R3 are the same as or different from each other, and are each independently a hydrogen or a substituted or unsubstituted alkyl group having 1 to 12 carbon atoms;

a low-boiling point solvent having a boiling point of less than 100° C.; and a high-boiling point solvent having a boiling point of 180° C. or more;

bringing a cliche into contact with an offset printing composition coating film applied on the silicone-based blanket to remove a part of the coating film; and transferring the offset printing composition coating film remaining on the silicone-based blanket to an object to be printed.

18. The offset printing method of claim 17, further comprising:

drying or curing the offset printing composition transferred to the object to be printed.